(12) United States Patent
Clüsserath

(10) Patent No.: US 11,345,073 B2
(45) Date of Patent: May 31, 2022

(54) METHOD AND DEVICE FOR PRODUCING AND FILLING CONTAINERS

(71) Applicant: KHS GmbH, Dortmund (DE)

(72) Inventor: Ludwig Clüsserath, Bad Kreuznach (DE)

(73) Assignee: KHS GmbH, Dortmund (DE)

(*) Notice: Subject to any disclaimer, the term of this patent is extended or adjusted under 35 U.S.C. 154(b) by 1058 days.

(21) Appl. No.: 14/768,607

(22) PCT Filed: Feb. 17, 2014

(86) PCT No.: PCT/EP2014/000428
§ 371 (c)(1),
(2) Date: Aug. 18, 2015

(87) PCT Pub. No.: WO2014/127903
PCT Pub. Date: Aug. 28, 2014

(65) Prior Publication Data
US 2016/0001488 A1 Jan. 7, 2016

(30) Foreign Application Priority Data
Feb. 19, 2013 (DE) ............ 10 2013 101 642.1

(51) Int. Cl.
*B29C 49/00* (2006.01)
*B29C 49/42* (2006.01)
(Continued)

(52) U.S. Cl.
CPC ........ *B29C 49/4252* (2013.01); *B23K 1/0016* (2013.01); *B23K 1/0056* (2013.01);
(Continued)

(58) Field of Classification Search
CPC ............... B29C 49/4252; B29C 49/46; B29C 2049/4602; B29C 2049/4605;
(Continued)

(56) References Cited

U.S. PATENT DOCUMENTS 6,984,360 B1* 1/2006 Feuilloley ............ A61L 2/208
141/6
2004/0089967 A1* 5/2004 Chatard .............. B05D 1/60
264/84

(Continued)

FOREIGN PATENT DOCUMENTS

DE 23 52 926 4/1975
DE 42 12 583 10/1993
(Continued)

*Primary Examiner* — Ryan M Ochylski
(74) *Attorney, Agent, or Firm* — Occhiuti & Rohlicek LLP

(57) ABSTRACT

An apparatus for transforming a preform into a container filled with liquid filling material includes a mold that forms a mold head, a sterilization system, a chamber that is common to a group of mold heads, an evacuation system that is connected to the chamber, and conduit lines, each of which connects a mold head to the chamber. The sterilization system sterilizes the interior of the preform while it is in sealing engagement with the mold head. The evacuation system creates a vacuum in the preform. Liquid filling material enters the preform under pressure and causes it to transform into a container.

21 Claims, 1 Drawing Sheet

(51) Int. Cl.

| | |
|---|---|
| *B65B 31/02* | (2006.01) |
| *B65B 55/08* | (2006.01) |
| *B65B 55/10* | (2006.01) |
| *B65B 3/02* | (2006.01) |
| *B29C 49/46* | (2006.01) |
| *B23K 1/00* | (2006.01) |
| *B23K 1/005* | (2006.01) |
| *H01L 23/00* | (2006.01) |
| *H01L 25/065* | (2006.01) |
| *B23K 26/14* | (2014.01) |
| *H01L 25/00* | (2006.01) |
| *B65B 3/10* | (2006.01) |
| *B29L 31/00* | (2006.01) |
| *B29C 49/14* | (2006.01) |
| *B29C 49/16* | (2006.01) |
| *B23K 101/42* | (2006.01) |
| *B29K 67/00* | (2006.01) |

(52) U.S. Cl.
CPC .......... *B23K 26/1462* (2015.10); *B29C 49/46* (2013.01); *B65B 3/022* (2013.01); *B65B 3/10* (2013.01); *B65B 31/025* (2013.01); *B65B 55/08* (2013.01); *B65B 55/10* (2013.01); *H01L 24/16* (2013.01); *H01L 24/75* (2013.01); *H01L 24/81* (2013.01); *H01L 25/0657* (2013.01); *H01L 25/50* (2013.01); *B23K 2101/42* (2018.08); *B29C 49/14* (2013.01); *B29C 49/16* (2013.01); *B29C 2049/465* (2013.01); *B29C 2049/4682* (2013.01); *B29C 2791/006* (2013.01); *B29C 2791/007* (2013.01); *B29K 2067/003* (2013.01); *B29L 2031/7158* (2013.01); *H01L 2224/13101* (2013.01); *H01L 2224/16057* (2013.01); *H01L 2224/16105* (2013.01); *H01L 2224/16108* (2013.01); *H01L 2224/16225* (2013.01); *H01L 2224/16227* (2013.01); *H01L 2224/75252* (2013.01); *H01L 2224/75263* (2013.01); *H01L 2224/75745* (2013.01); *H01L 2224/81121* (2013.01); *H01L 2224/81192* (2013.01); *H01L 2224/81193* (2013.01); *H01L 2224/81194* (2013.01); *H01L 2224/81224* (2013.01); *H01L 2224/81986* (2013.01); *H01L 2225/06551* (2013.01)

(58) Field of Classification Search
CPC ..... B29C 2049/4608; B29C 2049/4611; B29C 2049/4626; B29C 2049/4635
See application file for complete search history.

(56) References Cited

U.S. PATENT DOCUMENTS

| | | | |
|---|---|---|---|
| 2008/0156391 A1* | 7/2008 | Behar | B65D 83/0061 141/2 |
| 2009/0218733 A1* | 9/2009 | Andison | B29C 49/46 264/525 |
| 2011/0061343 A1* | 3/2011 | Roithmeier | B29C 49/42 53/452 |
| 2011/0272861 A1* | 11/2011 | Humele | A61L 2/22 264/457 |
| 2013/0078327 A1* | 3/2013 | Adriansens | B29C 49/46 425/210 |
| 2013/0193601 A1* | 8/2013 | Wilson | B29C 49/46 264/39 |
| 2015/0284115 A1* | 10/2015 | Voth | B65B 3/022 53/453 |

FOREIGN PATENT DOCUMENTS

| | | |
|---|---|---|
| DE | 43 40 291 | 6/1995 |
| DE | 10 2009 008 633 | 8/2010 |
| DE | 10 2011 009 889 | 8/2012 |
| DE | 10 2011 012 664 | 8/2012 |
| DE | 10 2011 012 665 | 8/2012 |
| EP | 2 161 202 | 3/2010 |
| FR | 2 774 912 | 8/1999 |
| JP | 2001212874 | 8/2001 |
| JP | 2002502669 | 1/2002 |
| JP | 2005335812 | 12/2005 |
| JP | 2010523374 | 7/2010 |
| JP | 2011506130 | 3/2011 |
| WO | WO2009/075791 | 6/2009 |
| WO | WO 2011154294 A1 * | 12/2011 ............. B29C 49/46 |

* cited by examiner

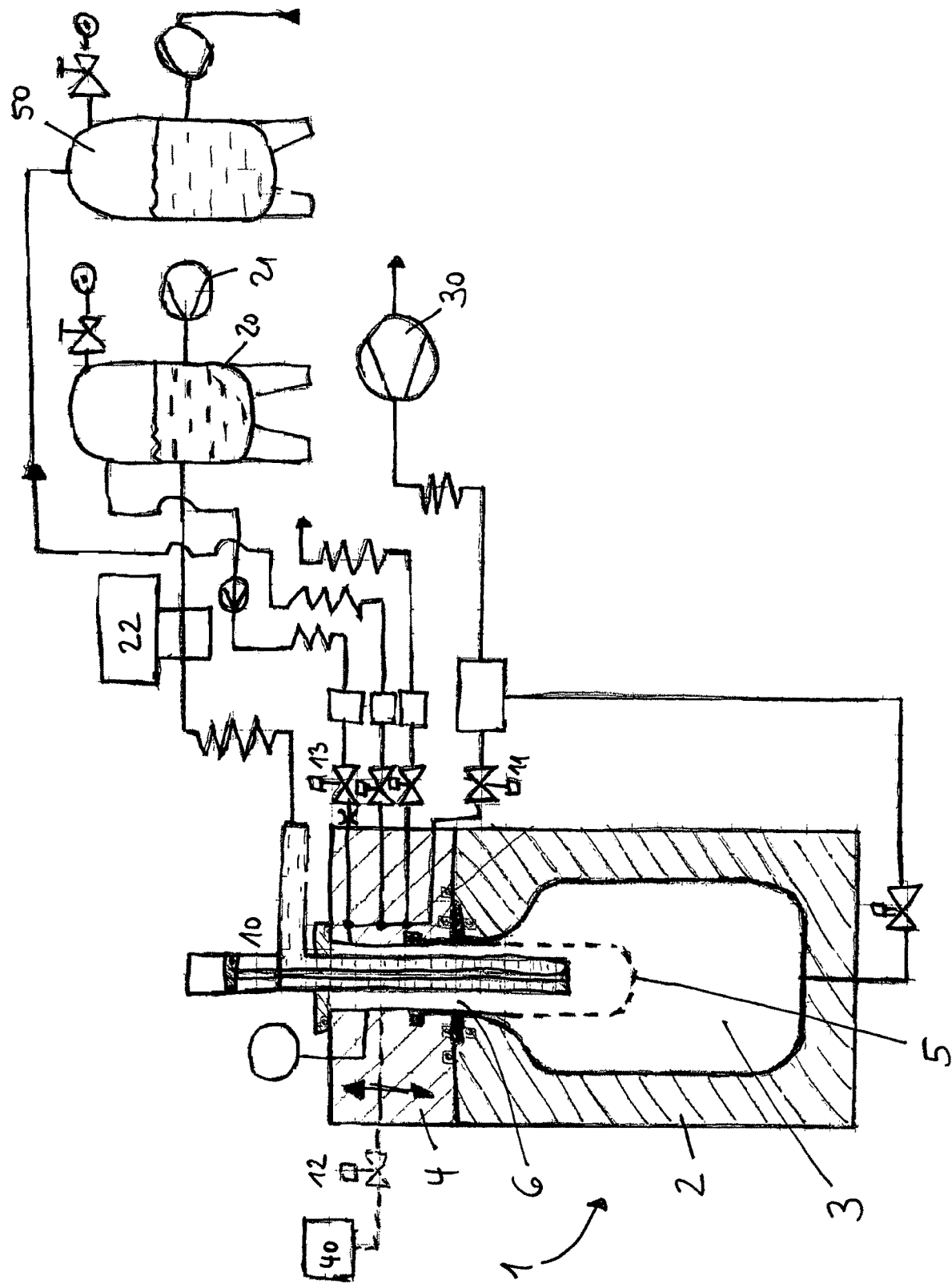

METHOD AND DEVICE FOR PRODUCING AND FILLING CONTAINERS

RELATED APPLICATIONS

This application is the national stage under 35 USC 371 of PCT/EP2014/000428, filed on Feb. 17, 2014, which claims the benefit of the Feb. 19, 2013 priority date of German application DE 102013101642.1, the contents of which are incorporated herein by reference.

FIELD OF INVENTION

The present invention relates to a method for producing containers from preforms and a device therefor.

BACKGROUND

It is known to produce containers by blowing pressure medium into a preform made of a thermoplastic material. An example of such a material is PET (polyethylene terephthalate). The procedure is generally referred to as "blow molding."

In blow-molding, preforms are conveyed through a heating device and a blowing device within a blow-molding machine. The heating device heats the preforms. The blowing device expands the heated preform biaxially or multi-axially to form a container. The expansion takes place with the aid of a compressed pressure medium, such as compressed air. This pressure medium is conducted at a cavity pressure into the preform that is to be expanded.

The process continues with conveying the containers, which have just been manufactured by blow molding, to a downstream filling device. There, a filling-machine fills the containers with a liquid filling-material.

SUMMARY

Among the objects of the invention is that of producing containers filled with liquid filling-material in way that promotes long storage-life of the liquid filling-material.

In one aspect, the invention features a method for transforming preforms into containers filled with liquid filling material. The method includes a form-and-fill phase in which the preform is formed into a container and filled while in a mold using hydraulic pressure from liquid filling-material conducted into the container. The preform is evacuated at least once before the form-and-fill phase begins. Using this method, it is possible to produce plastic containers. These containers include bottles made of PE, PP, and PET bottles, as well as kegs made of PET.

In another aspect, the invention features a device for transforming preforms into containers filled with liquid filling-material. The device includes at least one molding-and-filling station. The molding-and-filling station has at least one mold that forms a mold space and at least one mold head. The preform is located in a sealed position against this mold head. To mold the preform into a container, a liquid pressure medium is introduced via the mold head into the preform's interior. The mold head is provided with an evacuation system that evacuates the preform's interior. Alternatively, the mold head is functionally connected to such an evacuation system. This functional connection is achievable using one or more conduit lines.

In one practice of the method, the preform is evacuated at least once before the form-and-fill phase begins. After this evacuation, an inert gas or gas mixture is conducted into the preform to achieve pressure-balancing. Examples of a suitable inert gas include carbon dioxide and nitrogen. Alternatively, the preform can be flushed with an inert gas after evacuation.

In some practices, evacuation includes forming a vacuum having a pressure of between 50 and 200 mbar. This removes all foreign gases from the preform's interior, thus avoiding any harmful effect of such gases on the filling medium or that or that could have the effect of a germ cell for the gas release of a liquid containing carbonic acid in the event of a pressure drop, such as oxygen. Because of its relatively thick walls, a preform can withstand under-pressure better than a molded container. As a result, the preform will not deform, even with substantial under-pressure. Moreover, the volume of a preform is smaller than that of a molded container that it forms. Therefore, the volume to be evacuated is relatively small. As a result the method is economically advantageous.

After evacuation, the preform can be pressure-balanced and/or rinsed using a sterilization agent. A suitable sterilization agent is steam and/or a mixture of gas and steam. The steam can consist of only water vapor. However, it can also include an evaporated chemical sterilization agent. A suitable chemical sterilization agent is hydrogen peroxide. A sterilization agent can also be sterilizing gas or gas mixture. An example of a gaseous sterilizing agent is ozone, whether provided by itself or mixed with an inert gas.

Some embodiments include a radiation emitter disposed to irradiate the mouth of the preform, thereby sterilizing it. Suitable radiation emitters include those that emit UV light, whether steadily or in pulses.

In some practices, the molding-and-filling phase begins immediately after an evacuation or pressure-balancing, rinsing, and sterilization. The evacuation and rinsing can also be repeated several times. Doing so achieves the greatest possible freedom from contaminants, such as foreign gases, in the preform.

If necessary, the molding-and-filling phase begins with thermally conditioning the preform before the beginning of the molding process. In some practices, thermal conditioning takes place at temperatures between 70° C. and 120° C. In other practices, thermal conditioning takes place by running the preform through a heating tunnel or heating stretch before bringing the preform into the mold. Preferably, the mold is heated to maintain the preform's thermally conditioned state during its subsequent treatment. This subsequent treatment includes vacuuming, rinsing, and/or sterilization.

A preform that has been prepared in accordance with the method described herein can be molded and filled with a liquid filling medium within the framework of the molding-and-filling phase in one work cycle. The risk of renewed contamination can be reduced by immediate application of the method steps in the sequence disclosed herein.

In some embodiments, the mold head includes a suitable evacuation system for forming a vacuum within the preform's interior. Alternatively, the mold head is functionally connected to such an evacuation system. A typical evacuation system includes a vacuum pump that is connected to the mold head by conduit lines. Among these embodiments are those in which the pressure attained within the preform lies between 50 and 200 mbar.

In some embodiments, multiple mold heads connect to an under-pressure chamber or a vacuum chamber that is common to all of the mold heads. The common chamber in turn connects to an evacuation system, such as a vacuum pump. In particular, all the mold heads can be connected by conduit lines to a single vacuum chamber. Among these embodiments are those in which the common vacuum chamber is formed as one or more ring boilers or ring pipes.

Embodiments also include those that have a thermal conditioning system for thermally conditioning the preform.

In other embodiments, the mold head includes means for introducing a sterilization agent into the preform's interior. Examples of sterilizing agents include steam, a mixture of gas and steam, ozone, and/or hydrogen peroxide. The preform can thereby be effectively disinfected. This promotes a longer storage-life for the liquid filling-material that fills the container.

In yet other embodiments, the mold head includes means for introducing an inert gas into the preform's interior. Suitable inert gases include carbon dioxide and nitrogen. As a result of these gases, the preform's interior can be rendered effectively inert. This contributes to long storage-life of the filled medium.

In yet other embodiments, the mold head includes a radiation emitter for sterilizing the mouth of the preform. An example of a suitable emitter is a UV emitter that emits steady or pulsed UV light. With such an emitter, the preform can be sterilized before the beginning of the form-and-fill phase. This avoids having to subject the finished filled container to another sterilization process.

In one aspect, the invention features a method for producing containers filled with liquid filling material. Such a method includes evacuating a preform, after evacuating the preform, rinsing the preform with a sterilizing agent, and causing liquid filling material to enter the preform. The resulting hydraulic pressure from the liquid filling material transforms the preform into a container. Many sterilizing agents can be used. Examples of sterilizing agents include steam and a mixture of gas and steam. A variety of containers can also be processed. These include bottles and kegs. In either case, the container can be made of various materials, including PE, PP, and PET.

In some practices, rinsing the preform with a sterilizing agent includes rinsing with evaporated hydrogen peroxide. In others, it includes rinsing with ozone.

In other practices, evacuating the preform is followed by conducting a gas into the preform, or by rinsing the preform with an inert gas. A variety of inert gases can be used, including nitrogen and/or carbon dioxide.

Additional practices include those in which the preform is evacuated to a pressure that is between 50 and 200 mbar.

Yet other practices include sterilizing a mouth of the preform with ultraviolet light.

In another aspect, the invention features an apparatus for transforming a preform into a container filled with liquid filling material. Such an apparatus includes a forming-and-filling station that has a mold. The mold forms a mold chamber and a mold head. The mold head is configured to enter into sealing engagement with a mouth of a preform and to introduce liquid filling material under pressure into the preform through the mouth to enable transformation of the preform into a container. Also included in the apparatus is an evacuation system that is configured for evacuating the preform when the mouth of the preform is in sealing engagement with the mold head. The evacuation system is either integrated into the mold head or connected to the mold head by a conduit line. In addition, the apparatus includes a sterilization system for introducing sterilizing agent into a preform's interior when the mouth of the preform is in sealing engagement with the mold head. Various sterilizing agents, such as steam, a mixture of gas and steam, ozone, and hydrogen peroxide can be used. The apparatus also includes a chamber that is connected to the mold head. This chamber is either an under-pressure chamber or a vacuum chamber, and is common to a group of mold heads, all of which are connected to the chamber by corresponding conduit lines. An evacuation system connected to the chamber thus evacuates all the preforms at all the mold heads connected to the chamber.

In some embodiments, the chamber includes a ring boiler. In others, it includes a ring pipe.

Other embodiments include thermal conditioning system for heating the preform.

Yet other embodiments include means for introducing inert gas into the preform.

Also among the embodiments are those that includes a radiation emitter configured for sterilizing a mouth of the preform when the preform is engaged in the mold head.

In another aspect the invention features an apparatus for transforming a preform into a container filled with liquid filling material. Such an apparatus includes a mold that forms a mold head, a sterilization system, a chamber that is common to a group of mold heads, an evacuation system that is connected to the chamber, and conduit lines, each of which connects a mold head to the chamber. The sterilization system sterilizes the preform's interior while it is in sealing engagement with the mold head. The evacuation system creates a vacuum in the preform. Liquid filling materiel enters the preform under pressure and causes it to transform into a container.

BRIEF DESCRIPTION OF THE DRAWINGS

These and other features of the invention will be apparent from the following detailed description and the accompanying figures, in which:

FIG. 1 shows in schematic representation of a system for producing containers filled with a liquid filling-material from preforms.

DETAILED DESCRIPTION

FIG. 1 shows a molding-and-filling station 1 having a mold 2 that forms a mold chamber 3. A mold head 4 closes the top of the mold 2. In operation, a preform 5 is introduced into the mold 4. When introduced, an opening 6 of the preform 5 lies sealed against the mold head 4.

A first delivery line connects the mold head 4 to a first storage container 20 that contains a liquid filling-material. A high-pressure pump 21 maintains the liquid filling-material under high pressure so that opening a first valve 10 conducts liquid filling-material into the preform 5. A magnetically inductive flow meter (MID) 22 disposed on the first delivery line measures the volume of liquid filling-material that is delivered to the preform 5.

A second delivery line connects the mold head 4 to a vacuum pump 30. A second valve 11 along the second delivery line selectively opens and closes a connection between the vacuum pump 30 and the mold head 4. When the second valve 11 is open, the vacuum pump 30 causes the pressure in the preform 5 to drop to around 100 mbar.

A third delivery line connects the mold head 4 to a second storage container 40. The second storage container 40 stores a sterilizing agent. Examples of sterilizing agent include steam and hydrogen peroxide vapor. A third valve 12 between the second storage container 40 and the mold head 4 permits selective exposure of the preform 5 to the contents of the second storage container 40.

A fourth delivery line connects the mold head 4 to third storage container 50 that stores an inert gas. One example of an inert gas includes carbon dioxide. Another example of an inert gas is nitrogen. A fourth valve 13 permits selective exposure of the preform 5 to inert gas stored in the third storage container 50.

In operation, the process of producing a container filled with a liquid filling-material includes introducing the preform 5 into the opened mold 2 and closing the mold head 4 to seal the opening 6 of the preform 5 against the mold head 4.

Once the preform 5 is properly seated, the second valve 11 opens, thus exposing the preform 5 to a vacuum generated by the vacuum pump 30. This evacuates the preform 5. Unlike an extruded container, the preform 5 is stable enough to resist deformation when exposed to substantial under-pressure. Because the preform 5 has a small volume, evacuation takes place quickly. This is advantageous because the overall processing time becomes shorter.

Next, the second valve 11 closes and the third valve 12 opens. This connects the preform 5 to the second storage container 40. The under-pressure that is still present in the pre-form 5 as a result of its having just been exposed to the vacuum pump 30 aspirates sterilizing agent stored in the second storage container 40 into the preform's interior. This sterilizes those surfaces of the preform 5 that will ultimately come in contact with liquid filling-material.

Next, the third valve 12 closes and the second valve 11 opens. This reconnects the vacuum pump 30 and thus causes another vacuum in the preform's interior.

Next, the second valve 11 closes and the fourth valve 13 opens. Because of the pressure imbalance, inert gas from the third storage container 50 floods into the preform's interior. This rinses the interior. The use of an inert gas as a rinsing agent is particularly advantageous because, it causes no deterioration of the liquid filling-material.

Next, the preform 5 is thermally conditioned in the usual and known manner before the form-and-fill process. Once the preform 5 is ready to be formed and filled, the fourth valve 13 closes and the first valve 10 opens. The forming-and-filling pressure prevailing in the first storage container 20 drives out any inert gas present in the preform 5 and also transforms the preform 5 into a container.

A known support system supports the preform 5 and controls its stretching. Examples of such known support systems include a stretching bar, a guide element engaging from below on the base of the preform 5, an application of under-pressure, or any combination thereof. Particularly advantageous are methods that avoid the use of a stretching bar is used in the interior of the preforms or containers, and instead guide the preform during its conversion from the outside, preferably by engaging the preform's base.

After extrusion and filling of the container, a head space is formed in a suitable manner, the container undergoes pressure-balancing, and is closed.

An apparatus can have multiple forming-and-filling stations 1 so that a plurality of containers can be formed simultaneously. In addition, the method described herein can be modified to have more than one cycle of evacuation and disinfection and/or more than one cycle of evacuation and rinsing with inert gas.

Having described the invention, and a preferred embodiment thereof, what is claimed as new, and secured by Letters Patent is:

1. A method for producing containers filled with liquid filling material, said method comprising evacuating gas from a preform, after having evacuated said gas from said preform, rinsing said preform with a sterilizing agent, and causing liquid filling material to enter said preform, thereby transforming said preform into a container using hydraulic pressure from said liquid filling material, wherein said container is selected from the group consisting of a keg and a bottle, and wherein said container is made from a material that is selected from the group consisting of PE, PP, and PET, said method further comprising causing a mold head that is part of a mold that forms a mold chamber to enter into sealing engagement with a mouth of said preform, wherein evacuating gas from said preform comprises, while said mouth is in sealing engagement with said mold head, using an evacuation system that is integrated into said mold head to connect said preform to a chamber that is common to a group of mold heads, all of which are connected to said chamber, and wherein rinsing said preform with said sterilizing agent comprises causing sterilizing agent to pass through a conduit that connects said preform's interior to a sterilization system while said preform's mouth is in sealing engagement with said mold head.

2. The method of claim 1, wherein rinsing said preform with a sterilizing agent comprises rinsing said preform with ozone.

3. The method of claim 1, further comprising, after having evacuated said gas from said preform, conducting a gas into said preform, wherein said gas is selected from the group consisting of nitrogen and carbon dioxide.

4. The method of claim 1, further comprising, after having evacuated said gas from said preform, rinsing said preform with an inert gas.

5. The method of claim 1, wherein evacuating said gas from said preform comprises evacuating said preform to a pressure that is between 50 and 200 mbar.

6. The method of claim 1, further comprising sterilizing a mouth of said preform with ultraviolet light while said preform is engaged in a mold.

7. The method of claim 1, further comprising, while said preform is engaged in said mold head, rinsing said preform, wherein causing liquid filling material to enter said preform is carried out with said preform still engaged in said mold head.

8. The method of claim 1, further comprising, prior to evacuating said gas from said preform, with said preform being engaged in said mold head, heating said preform and rinsing said preform with said sterilizing agent.

9. The method of claim 1, wherein rinsing said preform with said sterilizing agent comprises aspirating said sterilizing agent from said preform.

10. The method of claim 1, wherein rinsing said preform with said sterilizing agent comprises using a vacuum pump to remove said sterilizing agent from said preform.

11. The method of claim 1, wherein producing said containers comprises exposing said preform to a vacuum at least twice prior to causing said liquid filling-material to enter said preform.

12. The method of claim 1, wherein rinsing said preform with sterilizing agent comprises disconnecting said preform from a vacuum source and causing said sterilizing agent to be aspirated into said preform by a vacuum therein.

13. The method of claim 1, wherein evacuating said preform comprises causing a wall of said preform to sustain a pressure difference that would be unsustainable for a container that said preform is to become.

14. The method of claim 1, further comprising, between causing liquid filling-material to enter said preform and rinsing said preform with said sterilizing agent, causing said preform to be rinsed with an inert gas by disconnecting a vacuum source from said preform and causing said inert gas to be aspirated into said container by a vacuum.

15. The method of claim 1, further comprising, using a radiation emitter, sterilizing a mouth of said preform when said preform is engaged in said mold head.

16. The method of claim 1, further comprising passing said sterilizing agent into said preform through a stretching bar.

17. The method of claim 1, further comprising conducting gas into said preform through a stretching bar.

18. The method of claim 1, wherein evacuating said preform and introducing said sterilizing agent into said preform are carried out while said preform is in a mold.

19. The method of claim 1, wherein evacuating gas from said preform comprises avoiding deformation of said preform during evacuation of said gas.

20. The method of claim 1, further comprising selecting said preform to be sufficiently stable to resist deformation during evacuation of said gas.

21. The method of claim 1, further comprising selecting said preform to be sufficiently stable to avoid deformation when exposed to a pressure of one hundred millibars.

\* \* \* \* \*